United States Patent
Li

(10) Patent No.: US 11,705,510 B2
(45) Date of Patent: Jul. 18, 2023

(54) GATE-TURN-OFF THYRISTOR AND MANUFACTURING METHOD THEREOF

(71) Applicant: HANGZHOU UG MIN SEMICONDUCTOR TECHNOLOGY CO. LTD, Hangzhou (CN)

(72) Inventor: Simin Li, Beijing (CN)

(73) Assignee: HANGZHOU UG MIN SEMICONDUCTOR TECHNOLOGY CO. LTD, Hangzhou (CN)

( * ) Notice: Subject to any disclaimer, the term of this patent is extended or adjusted under 35 U.S.C. 154(b) by 287 days.

(21) Appl. No.: 17/259,197

(22) PCT Filed: Jul. 2, 2019

(86) PCT No.: PCT/CN2019/094298
§ 371 (c)(1),
(2) Date: Jan. 11, 2021

(87) PCT Pub. No.: WO2020/011053
PCT Pub. Date: Jan. 16, 2020

(65) Prior Publication Data
US 2021/0257485 A1    Aug. 19, 2021

(30) Foreign Application Priority Data
Jul. 11, 2018  (CN) ........................ 201810756090.5
May 29, 2019  (CN) ........................ 201910456864.7

(51) Int. Cl.
*H01L 29/745*   (2006.01)
*H01L 21/225*   (2006.01)
(Continued)

(52) U.S. Cl.
CPC ........ *H01L 29/745* (2013.01); *H01L 21/2253* (2013.01); *H01L 21/26513* (2013.01); *H01L 21/2855* (2013.01); *H01L 29/66363* (2013.01)

(58) Field of Classification Search
CPC ................. H01L 29/744; H01L 29/745; H01L 29/66363; H01L 29/0692; H01L 29/0839;
(Continued)

(56) References Cited

U.S. PATENT DOCUMENTS

| 5,198,687 A | 3/1993 | Baliga | |
| 2002/0030199 A1* | 3/2002 | Hirano | H01L 29/7416 257/107 |
| 2017/0256614 A1* | 9/2017 | Akiyama | H01L 29/4236 |

FOREIGN PATENT DOCUMENTS

| CN | 101546767 A | 9/2009 |
| CN | 105932054 A | 9/2016 |

(Continued)

*Primary Examiner* — Wasiul Haider
(74) *Attorney, Agent, or Firm* — Bayramoglu Law Offices LLC

(57) ABSTRACT

A gate-turn-off thyristor is provided. The gate-turn-off thyristor includes a plurality of strips formed by repeatedly arranging a plurality of N-type emitter regions with high doping concentration of an upper transistor on an upper surface of an N-type silicon substrate with high resistivity, wherein a periphery of each strip of the plurality of strips is surrounded with a P-type dense base region bus bar of the upper transistor, a cathode metal layer is disposed on an N-type emitter region of the plurality of N-type emitter regions of the upper transistor, and a P-type base region of the upper transistor is disposed below the N-type emitter region of the upper transistor; a side of the P-type base region of the upper transistor is connected to a P-type dense base region of the upper transistor or a P-type dense base region bus bar of the upper transistor.

14 Claims, 12 Drawing Sheets

(51) Int. Cl.
*H01L 21/265* (2006.01)
*H01L 21/285* (2006.01)
*H01L 29/66* (2006.01)

(58) Field of Classification Search
CPC ............. H01L 29/102; H01L 29/41716; H01L 29/0684; H01L 29/083; H01L 29/1012; H01L 27/0817; H01L 27/1027
See application file for complete search history.

(56) References Cited

FOREIGN PATENT DOCUMENTS

| | | | |
|---|---|---|---|
| CN | 106847810 A | 6/2017 | |
| CN | 106981510 A | 7/2017 | |
| CN | 108242465 A | 7/2018 | |
| CN | 108899358 A | 11/2018 | |
| CN | 110047913 B | 12/2020 | |

* cited by examiner

GATE-TURN-OFF THYRISTOR AND MANUFACTURING METHOD THEREOF

CROSS REFERENCE TO THE RELATED APPLICATIONS

This application is the national stage entry of International Application No. PCT/CN2019/094298, filed on Jul. 2, 2019, which is based upon and claims priority to Chinese Patent Application No. 201810756090.5, filed on Jul. 11, 2018, and Chinese Patent Application No. 201910456864.7, filed on May 29, 2019, the entire contents of which are incorporated herein by reference.

TECHNICAL FIELD

The invention belongs to the technical field of silicon power devices, and relates to a gate-turn-off thyristor.

BACKGROUND

Gate-Turn-Off Thyristors (GTOs) based on silicon have been available for more than 50 years. The prior art of the gate-turn-off thyristor structure is shown in FIG. 1. The gate-turn-off thyristor is a PNPN four-layer structure and can be seen as consisting of two bipolar junction transistors, namely an NPN upper transistor and a PNP lower transistor. An N-type emitter region, $N_2$, of the NPN upper transistor is connected to a cathode metal layer K. A P-type base region, $P_2$, of the NPN upper transistor is a P-type collector region of the PNP lower transistor. The P-type base region $P_2$ of the NPN upper transistor is connected to a gate metal layer G. A N-type collector region, $N_1$, of the NPN upper transistor is a N-type base region of the PNP lower transistor. A P-type emitter region, $P_1$, of the PNP lower transistor is connected to an anode metal layer A.

Although the gate-turn-off thyristors have been greatly developed for half a century, two major weaknesses of the gate-turn-off thyristors cannot be overcome in the world. One is poor resistance to dI/dt, requiring complex limiting circuits. The other is poor resistance to dV/dt, requiring complex absorption circuits. In addition, the current of the gate-turn-off thyristor is only suitable for the application field with voltages of 1000 A or more and 2500 V or more. The market demand for 50-500 A applications with voltages of 1200-1700 V is very large.

Previously, the mechanism by which the gate-turn-off thyristors are limited is not clear enough. The analysis is now given as follows.

When the gate-turn-off thyristor begins to conduct, current is concentrated in a very small region near the periphery of the emitter region of the upper transistor (the "periphery" refers to a peripheral region of the emitter region closest to a dense base region or a base region). "Current" refers to the "current" of a PNPN thyristor. The PNPN thyristor current then spreads "slowly" to regions to leave the periphery. This "slow" spreading of the current is different from transistors. If the current rises too rapidly, the current density near the periphery of the emitter region of the upper transistor is too high. Furthermore, due to contamination, defects and the like, the current density at some points is always greater than that in other places to burn out first. Thus, the peripheral current density of the emitter region of the upper transistor limits the dI/dt of the gate-turn-off thyristor. While the transistor conduct from the "periphery", the transistor current spreads rapidly and the current rise rate does not cause the periphery to burn out. Thus, the peripheral current density of the emitter region does not limit the dI/dt of the transistor.

When the gate-turn-off thyristor is cut off, there is a dV/dt change in the external power grid. This will produce a displacement current d(CV)/dt, which is initially concentrated near the periphery of the emitter region of the upper transistor. The greater the current, the greater the current gain a of a common base. When the current density increases at a point near the periphery of the emitter region of the upper transistor such that $\alpha1+\alpha2=1$ at that point, the point changes from off to on, resulting in failure of the entire gate-turn-off thyristor. Thus, the peripheral current density of the emitter region of the upper transistor also constitutes a limit on the dV/dt of the gate-turn-off thyristor.

The gate-turn-off thyristor is composed of many cells. The total length of the periphery of the emitter region of the upper transistor of the gate-turn-off thyristor is equal to the sum of the peripheral lengths of the emitter regions of the upper transistors of all the cells. The cell size of the gate-turn-off thyristor of the prior art is large, and the short side length thereof reaches about 1000 μm. Thus, the number of cells is small and the sum of the peripheral lengths of the emitter regions of the upper transistors of the cells is small. If the cell size is reduced and the cell density is increased, and the total length of the periphery of the emitter region of the upper transistor is increased, the current density of the periphery of the emitter region of the upper transistor can be reduced, and the resistance of the gate-turn-off thyristor to dI/dt and dV/dt can be enhanced.

The dies of the gate-turn-off thyristors of the prior art are all round dies. A 2 to 6-inch chip is a die. The die area is too large, so that the die is only suitable for applications of 1000 A or more. In addition, the thickness of the die is all 350 μm or more, so that the die is only suitable for applications of 2500 V or more.

The new development of gate-turn-off thyristor is GCT-gate commutated thyristor. GCT employs two new technologies, a "buffer layer technology" and a "transparent anode technology". The buffer layer technology means that the N-type collector region of the upper transistor is divided into two layers, the resistivity of a lower layer, namely the buffer layer, is lower, and can reduce the thickness of the silicon wafer under the same rated voltage, so that the power consumption is reduced, and the efficiency is improved. Transparent anode technology refers to making the P-type emitter region of the lower transistor very thin, typically 10-15 μm, through which electrons can penetrate. By adopting the technology, the tail time of current turn-off can be shortened, so that turn-off loss is reduced. However, these two back-side technologies of GTC are done in conjunction with the front-side process, and the silicon wafer thickness cannot be reduced or otherwise fragmented.

SUMMARY

In order to solve the problems, the invention aims to provide a gate-turn-off thyristor aiming at the defects of the prior art, which has strong resistance to dI/dt and dV/dt and wide application range of current and withstand voltage.

It is another object of the present invention to provide a manufacturing method for a gate-turn-off thyristor.

In order to accomplish the purpose of the invention, the invention provides a gate-turn-off thyristor, comprising a plurality of strips formed by repeatedly arranging a plurality of N-type emitter regions with high doping concentration of an upper transistor on an upper surface of an N-type silicon substrate with high resistivity, wherein the periphery of each strip is surrounded with a P-type dense base region bus bar of the upper transistor, a cathode metal layer is disposed on the N-type emitter region of the upper transistor, and a P-type base region of the upper transistor is disposed below the N-type emitter region of the upper transistor; a side of the P-type base region of the upper transistor is connected to the P-type dense base region of the upper transistor or a P-type dense base region bus bar of the upper transistor with a higher doping concentration than that of the P-type base region of the upper transistor, wherein an N-type collector region of the upper transistor is arranged below the P-type base region of the upper transistor, the P-type dense base region of the upper transistor and the P-type dense base region bus bar of the upper transistor, and a P-type emitter region of the lower transistor is disposed below the N-type collector region of the upper transistor; the P-type emitter region of the lower transistor is located at the bottom layer of a silicon substrate; a lower surface of the P-type emitter region of the lower transistor is connected to an anode metal layer, and a gate metal layer is disposed above the silicon substrate; the P-type dense base region of the upper transistor and the P-type dense base region bus bar of the upper transistor are intersected or parallel; the upper surface of the P-type dense base region bus bar of the upper transistor is connected with the gate electrode metal layer; the repetitive distance between adjacent N-type emitter regions of the upper transistor in the strip is within 50 µm; and a die of the gate-turn-off thyristor is a square die.

Preferably, the P-type base region of the upper transistor and the P-type dense base region of the upper transistor are indirectly connected with the cathode metal layer by an oxide layer.

Preferably, the upper surface of the N-type emitter region of the upper transistor is directly connected with the cathode metal layer.

Preferably, a doped polycrystalline silicon layer is further included between the cathode metal layer and the silicon substrate, and the upper surface of the N-type emitter region of the upper transistor is indirectly connected with the cathode metal layer by the doped polycrystalline silicon layer.

Preferably, the N-type collector region of the upper transistor is further divided into an upper layer and a lower layer, wherein the resistivity of the lower layer is lower than that of the upper layer.

Preferably, adjacent P-type dense base regions of the upper transistor are overlapped with each other, and the overlapped portions form a P-type base region of the upper transistor.

Preferably, the N-type emitter region of the upper transistor is connected above both the upper surfaces of the P-type base region of the upper transistor and the P-type dense base region of the upper transistor.

Preferably, the surface impurity concentration of the P-type dense base region of the upper transistor is 3 times or more higher than that of the P-type base region of the upper transistor.

Preferably, the thickness of the P-type emitter region of the lower transistor is less than 3 µm.

The invention also provides a manufacturing method for the gate-turn-off thyristor, which comprises the process steps of:

A. providing a set of masks for the gate-turn-off thyristor, comprising: a first mask which is a mask of an N-type emitter region pattern of an upper transistor, wherein the N-type emitter region pattern of the upper transistor is composed of a plurality of N-type emitter region strips formed by repeatedly arranging a plurality of N-type emitter region pattern units of the upper transistor, and the repetitive distance between adjacent N-type emitter regions of the upper transistor in the N-type emitter region strips of the upper transistor is within 50 µm; a second mask which is a mask containing a P-type dense base region pattern of the upper transistor and a P-type dense base region bus bar pattern of the upper transistor, wherein the P-type dense base region pattern of the upper transistor is composed of a plurality of P-type dense base region strips of the upper transistor formed by repeatedly arranging a plurality of P-type dense base region pattern units of the upper transistor; the repetitive distance of adjacent P-type dense base region pattern units of the upper transistor in the P-type dense base region strip of the upper transistor is the same as that of adjacent N-type emitter region pattern units of the upper transistor in the N-type emitter region strip of the upper transistor; the P-type dense base region bus bar pattern of the upper transistor is intersected with or parallel to the P-type dense base region pattern of the upper transistor, and the P-type dense base region bus bar pattern of the upper transistor surrounds the P-type dense base region strip of the upper transistor; and when the P-type dense base region pattern of the upper transistor on the second mask is aligned with the N-type emitter region pattern of the upper transistor on the first mask, the P-type dense base region bus bar pattern of the upper transistor also surrounds the emitter region strip of the upper transistor;

B. providing an N-type silicon substrate with high resistivity;

C. forming a P-type base region of the upper transistor, a P-type dense base region of the upper transistor and a P-type dense base region bus bar of the upper transistor by adopting a second mask through oxidation, photoetching, etching, boron ion implantation and diffusion propulsion processes, wherein an oxide layer is formed on the upper surface of the silicon substrate after the diffusion propulsion;

D. selectively etching the oxide layer by adopting the first mask, completely etching the oxide layer of an emitter region window of the upper transistor on the P-type base region of the upper transistor, and keeping the oxide layer on the P-type dense base region of the upper transistor and the P-type dense base region bus bar of the upper transistor;

E. depositing a polycrystalline silicon layer;

F. implanting phosphorus ions to form an N-type doped polycrystalline silicon layer, and causing the N-type doped polycrystalline silicon layer by diffusion propulsion into an upper part of the P-type base region of the upper transistor so as to form an N-type emitter region of the upper transistor;

G. selectively masking and etching the doped polycrystalline silicon layer, keeping the doped polycrystalline silicon layer above the N-type emitter region of the upper transistor, and not keeping the doped polycrystalline silicon layer above the P-type dense base region bus bar of the upper transistor;

H. selectively etching the oxide layer, and completely etching the oxide layer on the P-type dense base region bus bar of the upper transistor to form a contact hole;

I. sputtering a metal layer;

J. selectively masking and etching the metal layer to form a cathode metal layer and a gate metal layer which are separated from each other;

K. thinning a back surface;

L. removing a damaged layer from the back surface;

M. implanting boron into the back surface;

N. annealing and activating; and

O. sputtering a anode metal layer on a back surface.

The invention has the following beneficial effects.

The invention provides a gate-turn-off thyristor which is improved over the existing thyristor in that:

1. The resistance of the gate-turn-off thyristor to dI/dt and dV/dt are enhanced, and the reliability is increased.

2. The requirement on a driving circuit is reduced, an absorption circuit is not needed, a limiting circuit is not needed or only a simple limiting circuit is used, and the cost of the circuit is reduced by more than half.

3. The current specification and the withstand voltage specification are wide. According to the GTO in the traditional technology, the current specification is only suitable for 1000 A or more, the voltage specification is 2500 V or more. According to the invention, the current specification is suitable for 50 A or more, the voltage specification is suitable for 1200 V or more, and the current specification and the voltage specification are greatly enlarged compared with those in the traditional technology.

4. The switching speed is high, and can be improved by one time or more, so that the dynamic power consumption is low.

5. The thyristor temperature is low, and corresponding requirements on package are reduced. The module package can be replaced by the single thyristor package, and the vehicle module package can be replaced by the industrial module package, so that the same reliability is achieved, and the package cost is reduced by a half or more.

6. The chip processing cost is low, it is easy for large-scale production. The GTOs of the prior art all have a large wafer that is a die. Even for an advanced GCT, its die face is only 2-4 inches. For the GTO provided by the invention, the chips are 6 to 8 inches, and the area of one chip is equal to several times that of the prior art. Therefore, the production efficiency is high, and the production cost is low. The GTO of the present invention can be produced using a 3 μm MOS line. The capacity of the existing 3 μm MOS line in China to produce chips is several hundred times higher than that of GTO or GCT in the prior art, so that it is easy to realize large-scale production.

REFERENCE NUMERALS

1: a cathode metal layer; 2: a P-type base region of an upper transistor; 3: an upper transistor N-type emitter region; 31: an N-type emitter region pattern unit of an upper transistor; 4: an N-type collector region of an upper transistor; 41: an N-type high-resistivity layer of an upper transistor N-type collector region of an upper transistor; 42: an N-type low-resistivity layer of an N-type collector region of an upper transistor; 5: a P-type dense base region bus bar of an upper transistor; 51: a P-type dense base region bus bar pattern of an upper transistor; 6: a P-type dense base region pattern of an upper transistor; 61: a P-type dense base region pattern unit of an upper transistor; 7: an oxide layer; 8: an anode metal layer; 9: a doped polycrystalline silicon layer; 10: a gate metal layer; 11: a P-type emitter region of lower transistor; 12: a silicon substrate.

DETAILED DESCRIPTION OF THE EMBODIMENTS

The present invention will now be described by way of specific examples.

Firstly, the shape of an N-type emitter region of an upper transistor of the present invention may be rectangular, square, hexagonal, circular, trapezoidal, triangular or other shapes, as well as patterns of various combinations of shapes, generally rectangular. For the sake of simplicity and convenience, the description of various parts of the present description adopts that a N-type emitter region of the upper transistor is rectangular, a P-type base region of the upper transistor is rectangular, and a P-type dense base region of the upper transistor is rectangular. This is a common finger-fork structure for power transistors.

Secondly, "connected" referred to herein essentially refers to an electrical connection, i.e., electrical communication. The physical structure may be a direct or indirect connection, neither affecting electrical communication.

Thirdly, the "repetitive distance" in the present invention refers to the distance between two patterns plus the size of one of the patterns.

Figure 1:
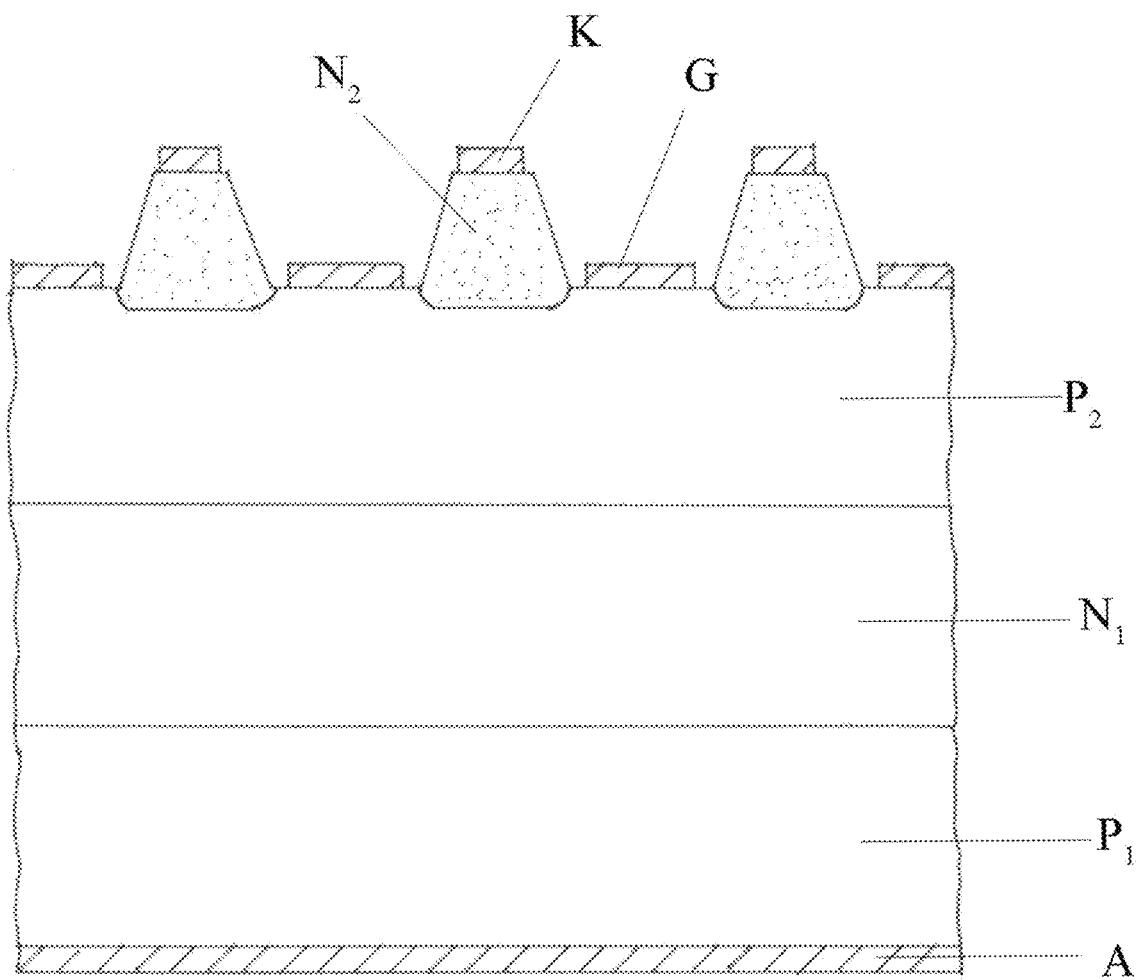
FIG. 1 is a structure diagram of a prior art.
Figure 2:
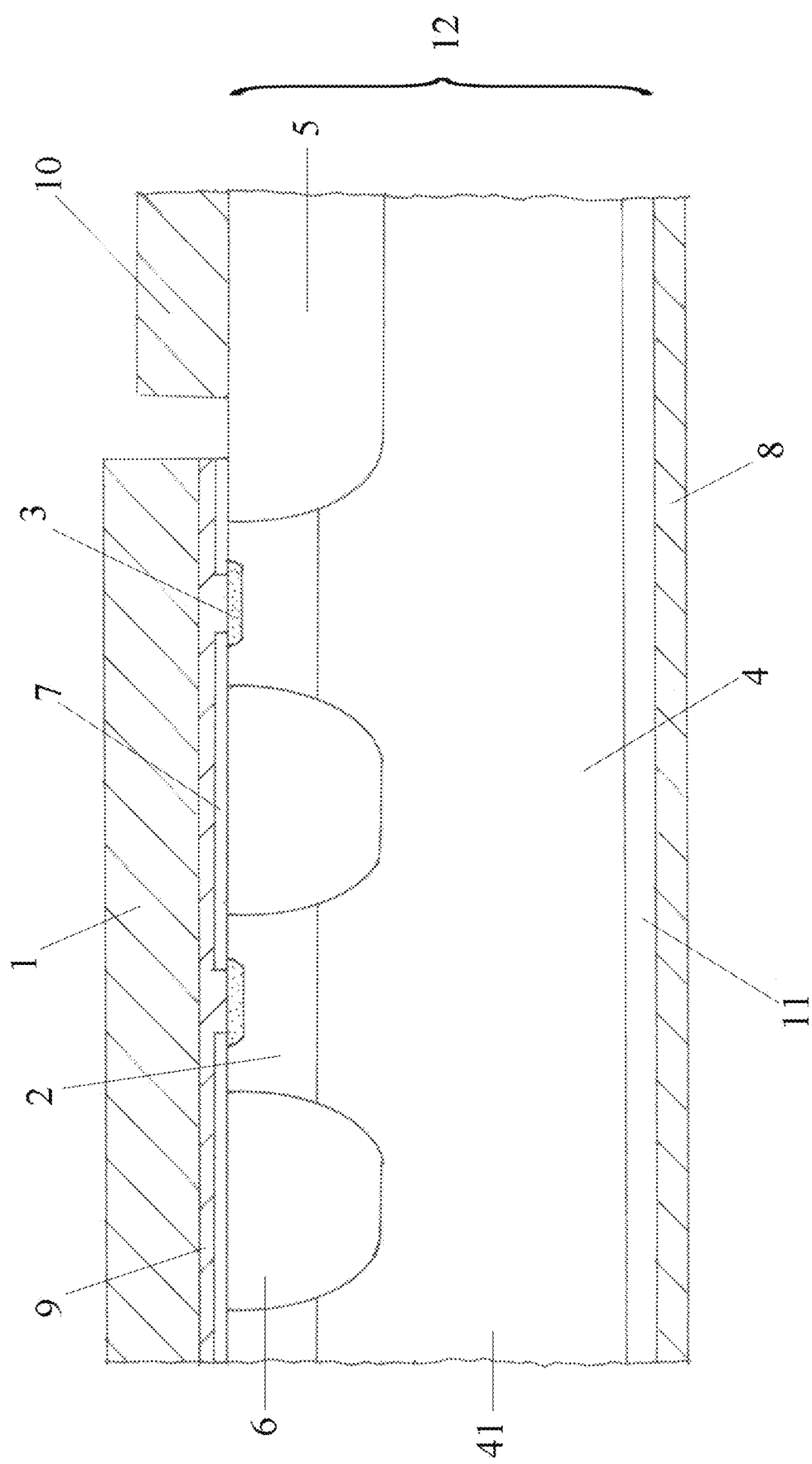
FIG. 2 is a structure diagram of a first preferred embodiment of a gate-turn-off thyristor according to the present invention.

According to a first preferred embodiment of a gate-turn-off thyristor, the structure is shown in FIG. 2.

A plurality of strips are formed by repeatedly arranging a plurality of N-type emitter regions 3 of an upper transistor with high doping concentration on an upper surface of an N-type silicon substrate 12 with high resistivity, wherein the periphery of each strip is surrounded with a P-type dense base region bus bar 5 of the upper transistor. A P-type base region 2 of the upper transistor is disposed below the N-type emitter region 3 of the upper transistor; a side of the P-type base region 2 of the upper transistor is the P-type dense base region 6 of the upper transistor or a P-type dense base region bus bar 5 of the upper transistor with a higher doping concentration than that of the P-type base region 2 of the upper transistor; An N-type collector region 4 of the upper transistor is arranged below the P-type base region 2 of the upper transistor, the P-type dense base region 6 of the upper transistor and the P-type dense base region bus bar 5 of the upper transistor, and a P-type emitter region 11 of the lower transistor is disposed below the N-type collector region 4 of the upper transistor; the P-type emitter region 11 of the lower transistor is located at the bottom layer of a silicon substrate 12; a lower surface of the P-type emitter region 11 of the lower transistor is connected to an anode metal layer 8. The P-type dense base region 6 of the upper transistor and the P-type dense base region bus bar 5 of the upper transistor are intersected or parallel. In order to show more structures, FIG. 2 selects a portion of the P-type dense base region 6 of the upper transistor parallel to the P-type dense base region bus bar 5 of the upper transistor. In FIG. 2, the P-type thick base region bus bar 5 of the upper transistor is directly connected to the gate metal layer 10. The surfaces of the P-type dense base region 6 of the upper transistor and the P-type base region 2 of the upper transistor are covered with an oxide layer 7, and the oxide layer 7 is covered with a doped polycrystalline silicon layer 9. However, the surface of the N-type emitter region of the upper transistor is free of the oxide layer 7, so that it is directly connected with the doped polycrystalline silicon layer 9. A cathode metal layer 1 is covered above the doped polycrystalline silicon layer 9. Since the surface of the N-type emitter region 3 of the upper transistor is not covered with the oxide layer 7, the cathode metal layer 1 can be indirectly connected with the N-type emitter region 3 of the upper transistor by the conductive layer doped polycrystalline silicon layer 9. The doped polycrystalline silicon has the capability of resisting Na ion contamination to improve the reliability of the device. The N-type emitter region 3 of the upper transistor in this embodiment has a width of 6 μm and a length of 100 μm, and the repetitive distance between adjacent N-type emitter regions 3 of the upper transistor is 20 μm.

Figure 3:
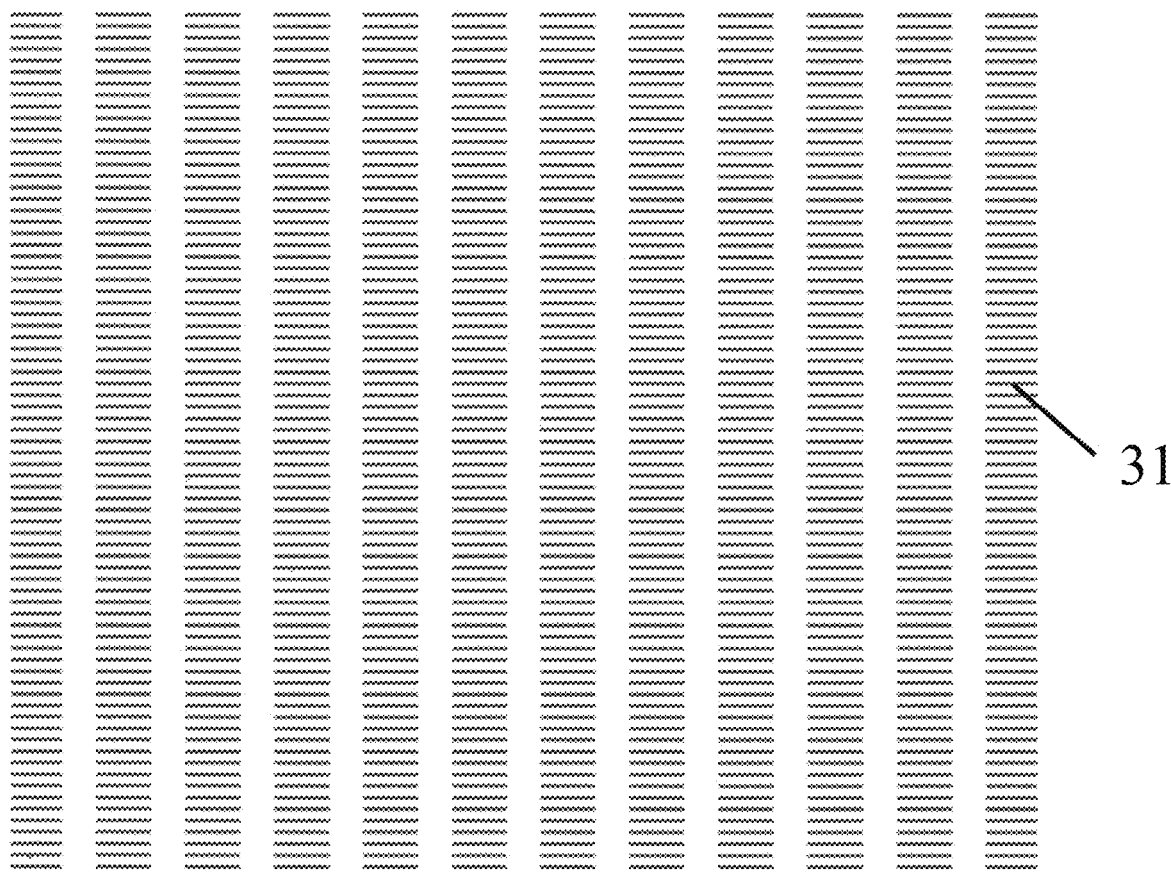
FIG. 3 is a schematic diagram of an upper transistor N-type emitter region pattern of a first mask of the first preferred embodiment of the gate-turn-off thyristor according to the present invention.

FIG. 3 is a schematic diagram of a first mask of the first preferred embodiment of the present invention, including an overall plan view of an N-type generation region pattern unit 31 of the upper transistor. The N-type generation region pattern unit 31 of the upper transistor is a black narrow strip rectangle, a plurality of N-type generation region pattern units 31 of the upper transistor form an N-type generation region strip of the upper transistor, and 12 columns of the N-type generation region pattern units 31 of the upper transistor can be seen from FIG. 3.

Figure 4:
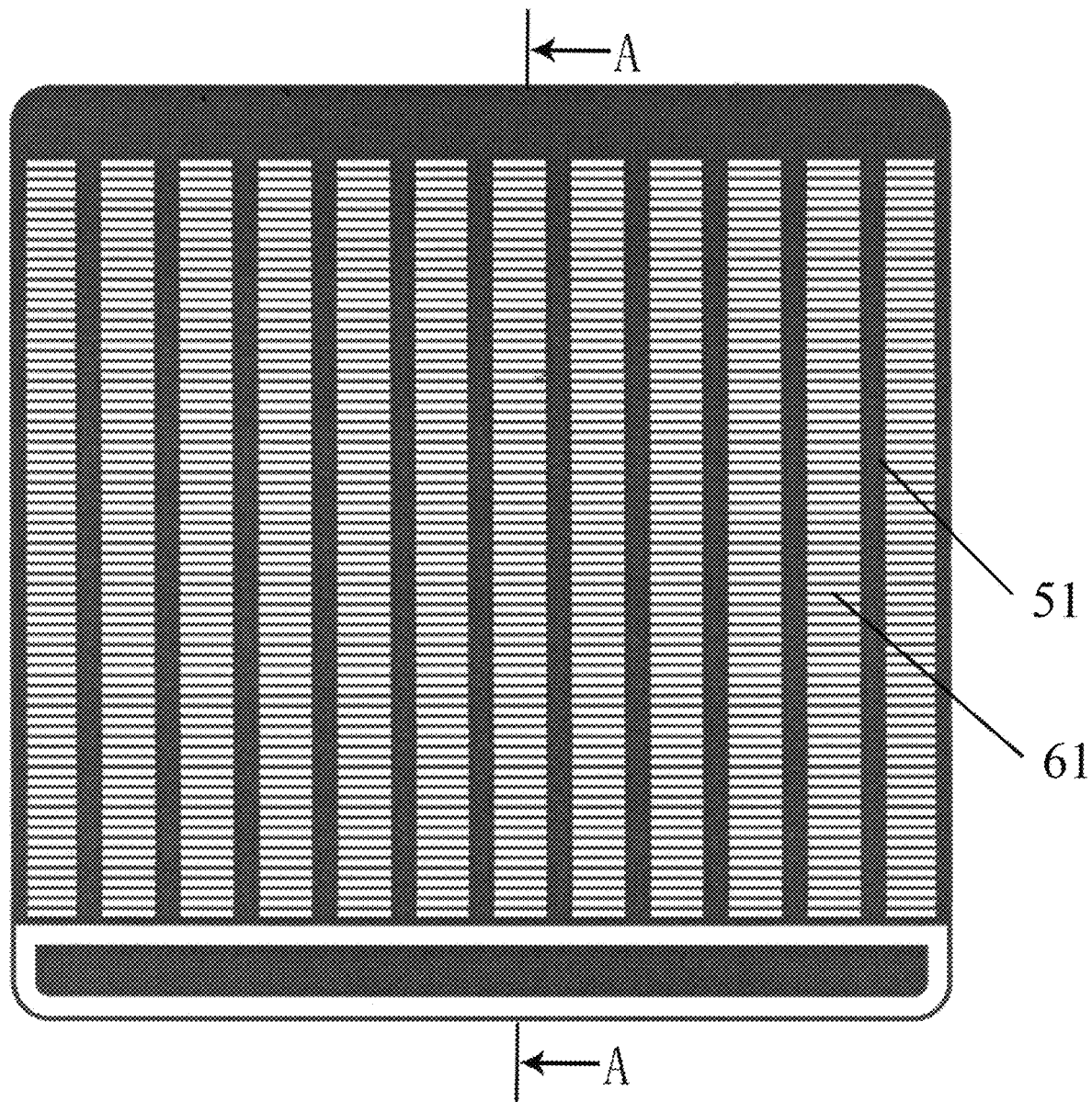
FIG. 4 is a schematic diagram of an upper transistor P-type dense base region pattern and an upper transistor P-type dense base region bus bar pattern of a second mask of the first preferred embodiment of the gate-turn-off thyristor according to the present invention.

FIG. 4 is a schematic diagram of a second mask according to the first preferred embodiment of the present invention, including an overall plan view including a P-type dense base region pattern unit 61 of the upper transistor and a P-type dense base region bus bar pattern 51 of the upper transistor. 13 black vertical strips and upper and lower black horizontal strips in FIG. 3 form the P-type dense base region bus bar pattern 51 of the upper transistor, the P-type dense base region pattern unit 61 of the upper transistor is a black narrow strip rectangle, the rectangles of a plurality of P-type dense base region pattern units 61 of the upper transistor form P-type dense base region strips, and 12 columns of P-type dense base region pattern units 61 can be seen in FIG. 4. The die of the gate-turn-off thyristor of the embodiment is a square die. The square dies can be easily manufactured into dies with various sizes of 0.5*0.5-15*15 mm$^2$ and packaged into single thyristor package and modules of 1-500 A.

Figure 5:
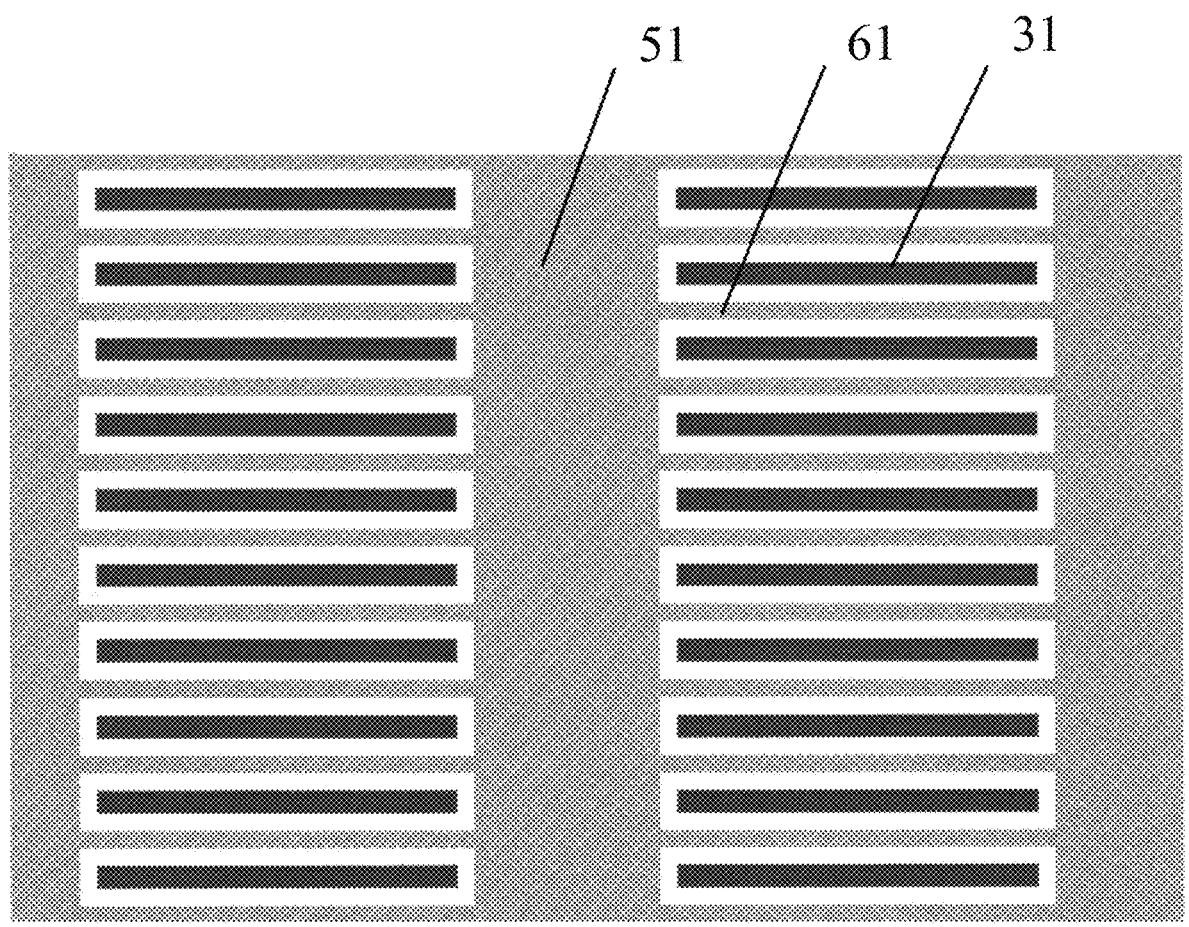
FIG. 5 is a partially enlarged schematic diagram of an upper transistor N-type emitter region pattern, an upper transistor P-type dense base region pattern, and an upper transistor P-type dense base region bus bar pattern after alignment of the first mask and the second mask of the first preferred embodiment of the gate-turn-off thyristor according to the present invention.

FIG. 5 is a partially enlarged schematic diagram after alignment of the first mask shown in FIG. 3 with the second mask shown in FIG. 4, including the P-type dense base region pattern unit 61 of the upper transistor and the P-type dense base region bus bar pattern 51 of the upper transistor, and the N-type emitter region pattern unit 31 of the upper transistor can be seen by enlargement. The relationship among the N-type emitter region pattern unit 31 of the upper transistor, the P-type dense base region pattern unit 61 of the upper transistor, and the P-type dense base region bus bar pattern 51 of the upper transistor is clearly shown in FIG. 5, and the P-type dense base region pattern unit 61 of the upper transistor and the P-type dense base region bus bar pattern 51 of the upper transistor are orthogonal to each other. In the embodiment, the N-type emitter region pattern unit 31 of the upper transistor and the P-type dense base region pattern unit 61 of the upper transistor are all rectangular. Correspondingly, the N-type emitter region 3 of the upper transistor, the P-type base region 2 of the upper transistor and the P-type dense base region of the upper transistor 6 are also rectangular.

In order to show more structures, a gate-turn-off thyristor position formed in a sectional view taken at A-A of FIG. 4 is shown in FIG. 2, where a region including a P-type dense base region bus bar 5 of the upper transistor is selected near an upper edge.

The repetitive units (i.e., cells) of the present invention are much smaller than those in the prior art. The repetitive distance between adjacent N-type emitter regions of the upper transistor of this embodiment, i.e., the width of the repetitive unit is 20 μm, while the repetitive distance between the upper transistor emitter regions of gate-turn-off thyristors in the prior art is about 1000 μm, and the repetitive unit of embodiments of the present invention is about 50 times smaller than the repetitive unit of the prior art. When the repetitive distance between adjacent N-type emitter regions of the upper transistor of the present invention, i.e., the width of the repetitive unit, is 50 μm, the repetitive unit of the present invention is about 20 times smaller than the repetitive unit of the prior art. Thus, the total peripheral length of the emitter region of the upper transistor of the gate-turn-off thyristor of the present invention is increased by at least one order of magnitude, and the peripheral current density of the emitter region of the upper transistor is decreased by at least one order of magnitude, thereby enhancing the resistance of the gate-turn-off thyristor to dI/dt and dV/dt by at least one order of magnitude.

Due to the fact that the cell of the gate-turn-off thyristor is small, the charging and discharging distance through the gate in the switching process is short, and the gate-turn-off thyristor has a low-resistance channel for the P-type dense base region of the upper transistor and the P-type dense base region bus bar of the upper transistor. Therefore, the switching speed of the gate-turn-off thyristor is fast. The rise time and the fall time are reduced by a half or more compared with the conventional method.

A method for manufacturing a GTO is described below with reference to a first preferred embodiment of a gate-turn-off thyristor shown in FIG. 2:

Firstly, providing a set of masks for the gate-turn-off thyristor, comprising: a first mask, as shown in FIG. 3, which is a mask of an N-type emitter region pattern of an upper transistor, wherein the N-type emitter region pattern of the upper transistor is composed of a plurality of N-type emitter region strips formed by repeatedly arranging a plurality of N-type emitter region pattern units 31 of the upper transistor, and the repetitive distance between adjacent N-type emitter region pattern units 31 of the upper transistor in the N-type emitter region strips of the upper transistor is 20 µm; a second mask, as shown in FIG. 4, which is a mask containing a P-type dense base region pattern of the upper transistor and a P-type dense base region bus bar pattern of the upper transistor, wherein the P-type dense base region pattern of the upper transistor is composed of a plurality of P-type dense base region strips of the upper transistor formed by repeatedly arranging a plurality of P-type dense base region pattern units 61 of the upper transistor; the repetitive distance of adjacent P-type dense base region pattern units 61 of the upper transist or in the P-type dense base region strip of the upper transistor is the same as that of adjacent N-type emitter region pattern units 31 of the upper transistor in the N-type emitter region strip of the upper transistor; the P-type dense base region bus bar pattern 51 of the upper transistor is intersected with or parallel to the P-type dense base region pattern of the upper transistor, and the P-type dense base region bus bar pattern 51 of the upper transistor surrounds the P-type dense base region strip pattern of the upper transistor; and when the P-type dense base region pattern of the upper transistor on the second mask is aligned with the N-type emitter region pattern of the upper transistor on the first mask, the P-type dense base region bus bar pattern 51 of the upper transistor also surrounds the emitter region strip of the upper transistor.

FIG. 6, FIG. 7, FIG. 8 and FIG. 2 are structure diagrams of the above-described embodiment after completion of corresponding process steps in the processing.

Figure 6:
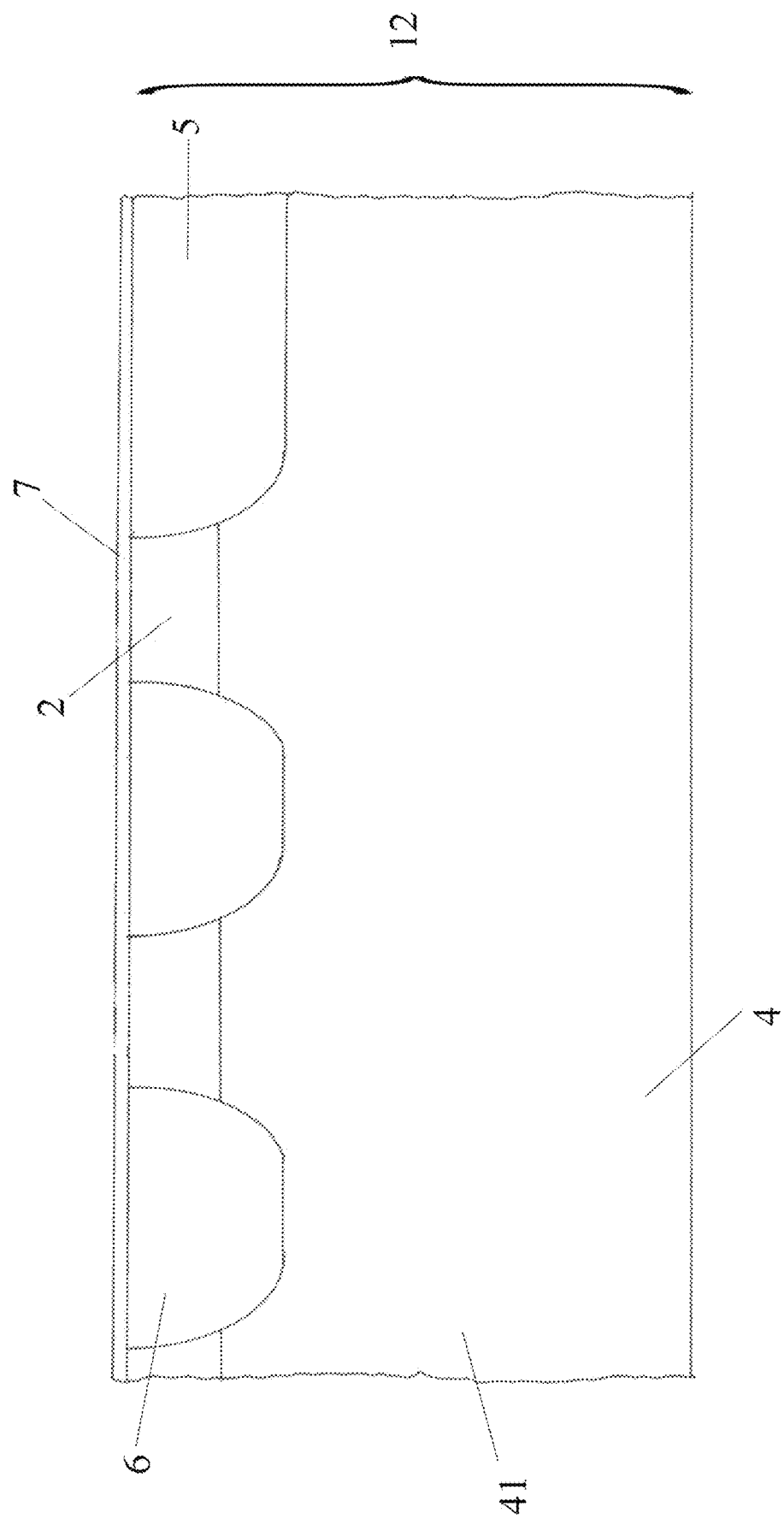
FIG. 6 is a structure diagram after completion of B-C of the first preferred embodiment of the gate-turn-off thyristor according to the present invention.

FIG. 6 corresponds to process steps B-C. The silicon substrate 12 is an N-type 6-inch single crystal wafer having a resistivity of 100-150 Ωcm and a thickness of 625 µm. A P-type base region 2 of the upper transistor, a P-type dense base region 6 of the upper transistor and a P-type dense base region bus bar 5 of the upper transistor are formed by adopting a second mask through oxidation, photoetching, etching, boron ion implantation and high-temperature propulsion. During the high-temperature propulsion, oxygen is added to grow a 1.5 µm thick oxide layer 7 on the upper surface of the N-type high resistivity substrate 12. The junction depth of the P-type dense base region 6 of the upper transistor and the P-type dense base region bus bar 5 of the upper transistor is 8 µm, and the surface concentration of boron was 5E18/cm$^3$. The junction depth of the P-type base region 2 of the upper transistor is 5 µm, and the surface concentration of boron was 5E17/cm$^3$. The surface concentration of boron in the P-type base region of the upper transistor is 10 times the surface concentration of boron in the P-type base region of the upper transistor. Usually, it is more than 3 times.

In addition, the P-type base region 2 of the upper transistor may be formed in a variety of ways, such as an oxide layer having a thickness of 0.1 µm, and a full wafer is implanted with boron ions. A single base mask may also be used. After the implantation of the base region, the base region is typically not propelled separately, but together with the dense base region.

Figure 7:
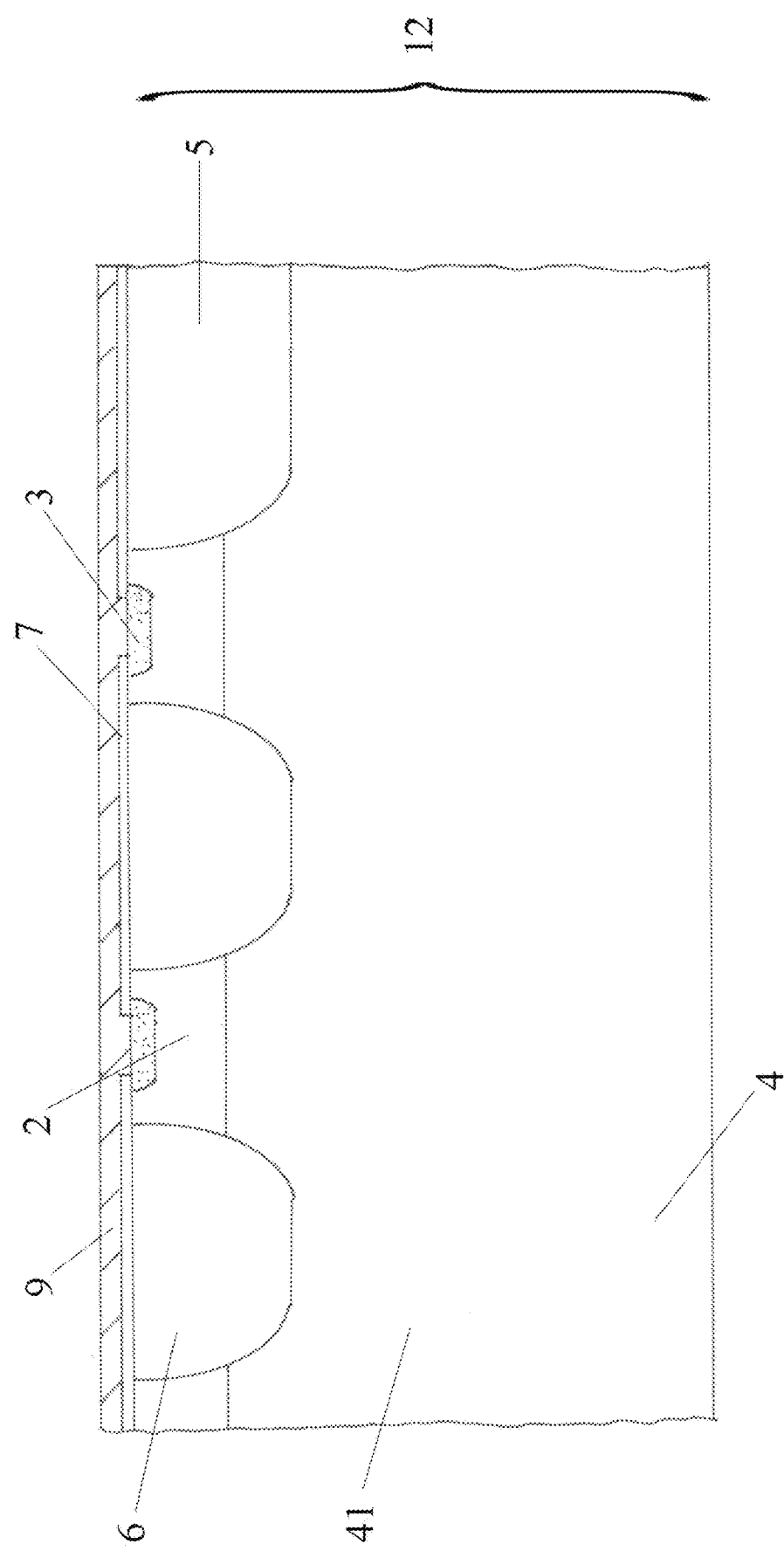
FIG. 7 is a structure diagram after completion of D-F of the first preferred embodiment of the gate-turn-off thyristor according to the present invention.

FIG. 7 corresponds to process steps D-F. Using the first mask (note alignment with the second mask), the oxide layer 7 is selectively etched by photoetching to completely etch the oxide layer of the N-type emitter window of the upper transistor above the P-type base region 2 of the upper transistor. A 0.6 µm thick doped polycrystalline silicon layer 9 is deposited by LPCVD. An N-type doped polycrystalline silicon layer 9 is formed by implanting phosphorus ions, and an N-type emitter region 3 of the upper transistor is formed by diffusion propulsion of the doped polycrystalline silicon layer 9 into an upper part of the P-type base region 2 of the upper transistor. The N-type emitter region 3 of the upper transistor has a surface concentration of phosphorus of 1E20/cm$^3$ and a junction depth of 3 µm.

Figure 8:
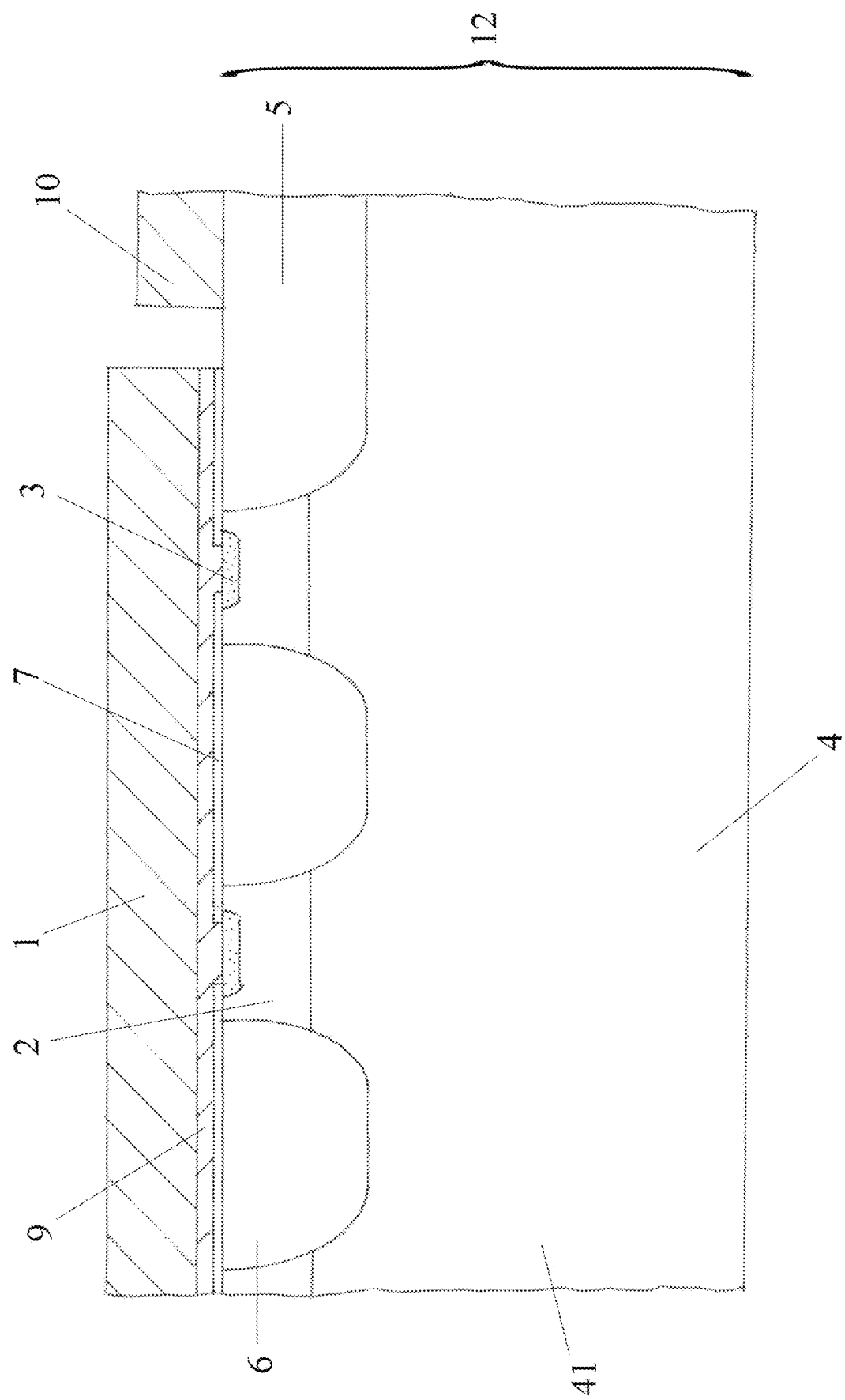
FIG. 8 is a structure diagram after completion of G-J of the first preferred embodiment of the gate-turn-off thyristor according to the present invention.

FIG. 8 corresponds to process steps G-J. The doped polycrystalline silicon layer 9 is selectively masked and etched, the doped polycrystalline silicon layer 9 is kept above the N-type emitter region 3 of the upper transistor, and the doped polycrystalline silicon layer 9 is not kept above the P-type dense base region bus bar 5 of the upper transistor. The oxide layer 7 is selectively etched, and the oxide layer 7 on the P-type dense base region bus bar of the upper transistor 5 is etched completely to form a contact hole. A metal layer is sputtered, and the metal layer is a 4 µm aluminum layer. The cathode metal layer 1 and the gate metal layer 10 are formed separately from each other by selectively masking and etching the metal layer.

FIG. 2 corresponds to process steps K-O and is shown as a structure diagram of the final die. The back surface of the chip is thinned to 180 µm, a damaged layer is removed from the back surface, boron is implanted, the implantation dose 11 of boron is 5E14-5E15/cm$^2$, the implantation energy is 60 KEV, and the P-type emitter region of the lower transistor is formed by annealing at 500° C. for 30 minutes. A three-layer metal of titanium, nickel and silver having a thickness of 1 µm is sputtered on the back surface to form an anode metal layer 8.

The thickness (calculated as projected distance+standard deviation*4) of the P-type emitter region 11 of the lower transistor this embodiment is only 0.1903+0.0556*4=0.4127 µm. Since the maximum energy of a conventional ion implanter is 200 KEV, the implanted boron can penetrate into silicon for 1 µm at most. Even if the energy of the ion implanter is increased later, it does not exceed 500 KEV, so that the implanted boron can penetrate into silicon for 2.5 µm at most.

According to the invention, the front surface is processed firstly and then the back surface. The cathode metal layer and the gate metal layer on the front surface are usually made by aluminum, and the aluminum is melted at 660° C., so that the activation temperature is generally about 500° C., boron cannot be diffused at low temperature, and can only be diffused at at least 800° C. or more. Therefore, the thickness of the P-type emitter region 11 of lower transistor of the gate-turn-off thyristor of the present invention is below 3 µm. The thickness of the P-type emitter region of the lower transistor of the gate-turn-off thyristor of the prior art is much more than 3 µm, typically 10-15 µm. Conventional 10-15 µm P-type layers have enabled the anode to be "transparent", and the gate-turn-off thyristor of the present invention has a P-type emitter region 11 of the lower transistor that is less than 3 µm, which is more easily for the "anode transparency", reducing tailing time. The trailing time when the current of the present invention is turned off is only 1/10 or less of the trailing time of a conventional gate-turn-off thyristor without the "anode transparency".

According to the invention, the front surface is processed firstly and then the back surface, so that the final chip can be 150 µm or larger, and it is also suitable for making a power device of 1000-2000V.

Figure 9:
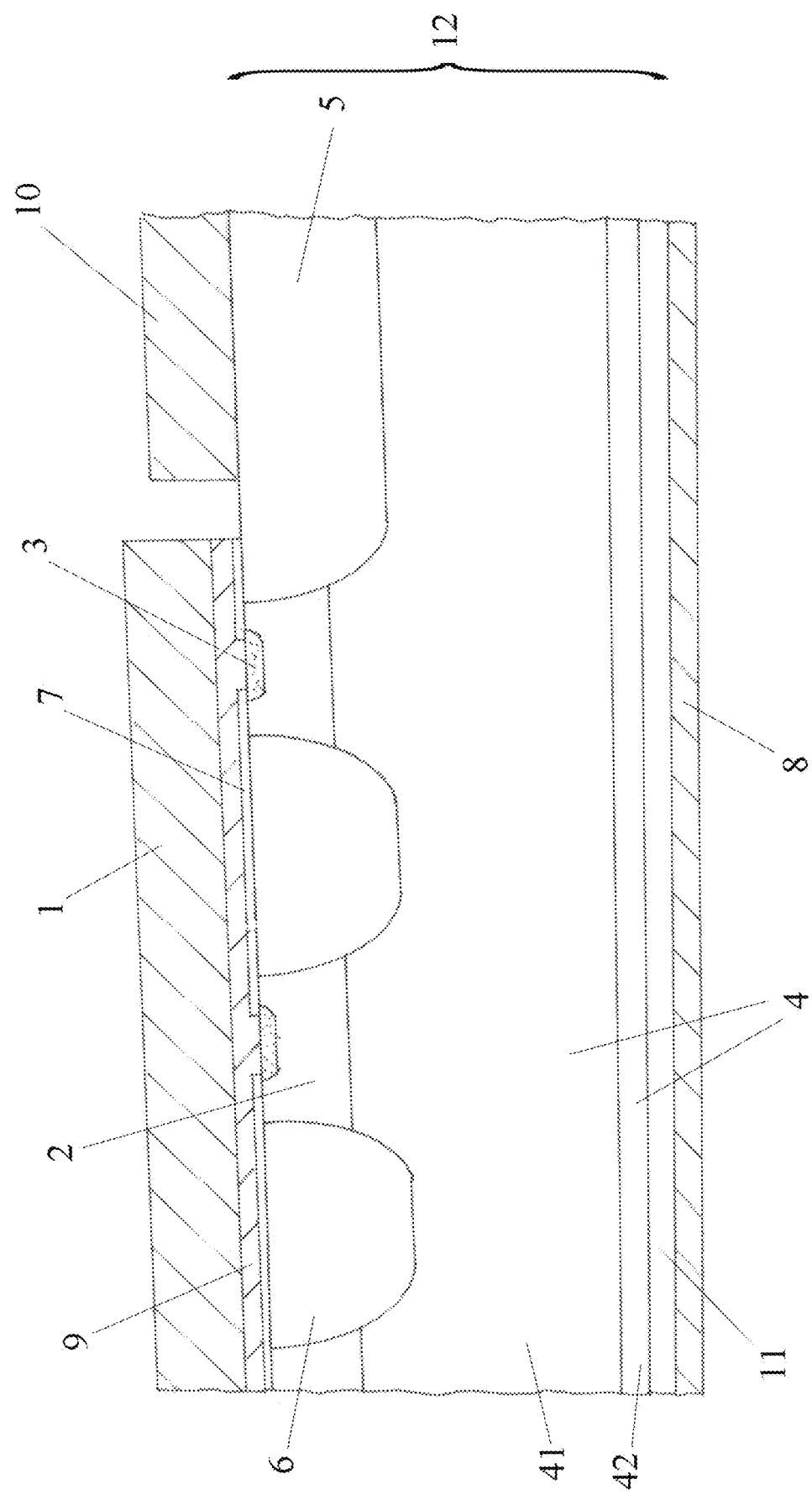
FIG. 9 is a structure diagram of a second embodiment of the gate-turn-off thyristor according to the present invention.

FIG. 9 is a structure diagram of a second embodiment of the present invention. FIG. 9 differs from FIG. 2 in that the N-type collector region 4 of the upper transistor of FIG. 9 is provided with an N-type low-resistivity layer 42 as a "buffer layer", which can reduce power consumption and improve efficiency.

The lower low-resistivity layer 42 of the N-type collector region of the upper transistor is formed as follows: after the front surface of the chip is processed, the back surface is thinned, a damaged layer is removed from the back surface, and then it is implanted twice. Phosphorus is first implanted using 200 KEV with a range (i.e., a projection distance) of 0.2539 μm and a dose of $5E13-5E14/cm^2$. Boron is then implanted using 30 KEV with a range (i.e., a projection distance) of 0.0987 μm at a dose of $5E14-5E15/cm^2$. An annealing activation is performed at 500° C. for 30 minutes. The lower low-resistivity layer 42, i.e. the "buffer layer", of the N-type collector region 4 of the upper transistor and the P-type emitter region 11 of the lower transistor are formed.

Figure 10:
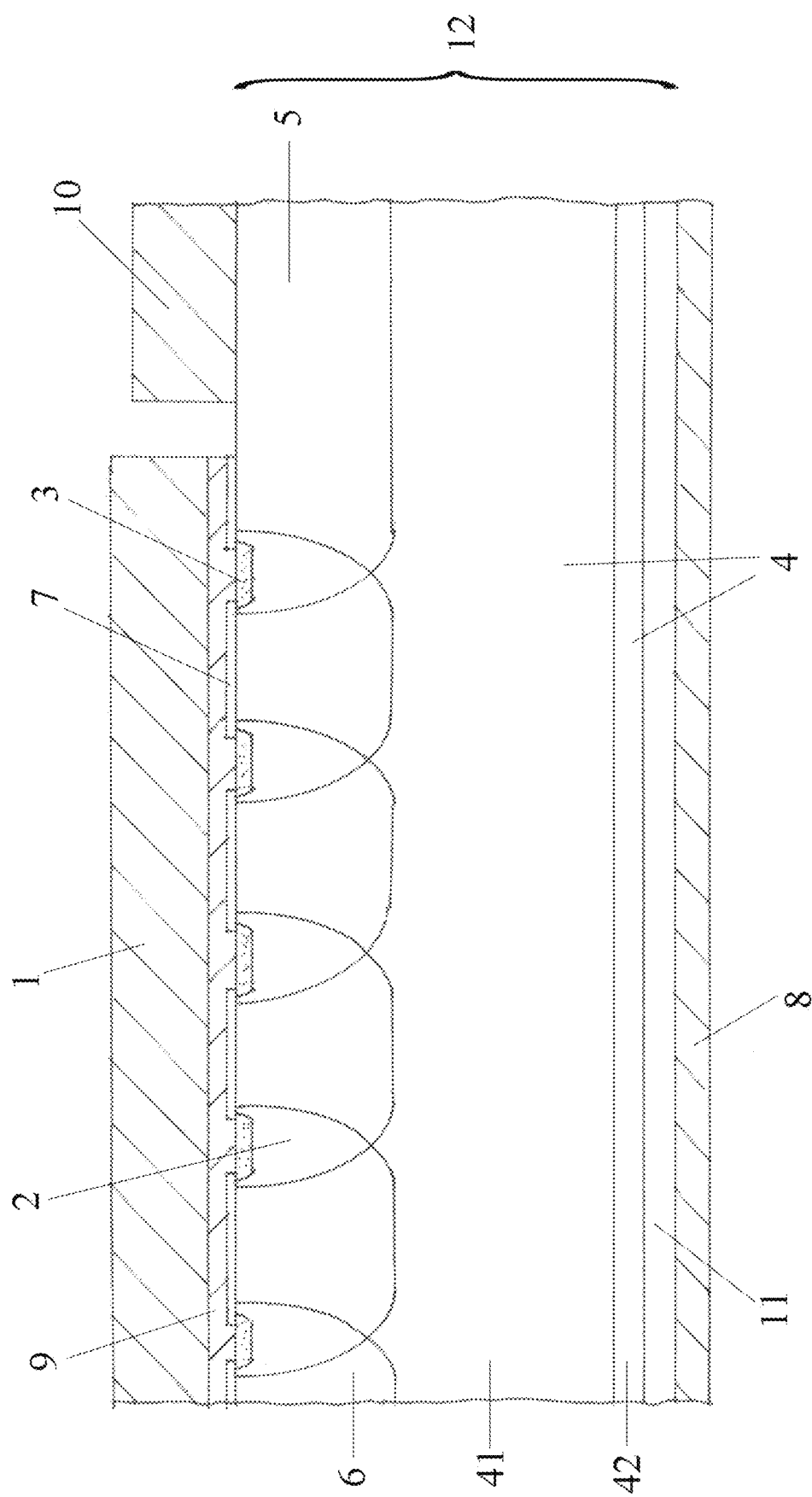
FIG. 10 is a structure diagram of a third embodiment of the gate-turn-off thyristor according to the present invention.

FIG. 10 is a structure diagram of a third embodiment of the present invention. FIG. 9 differs from FIG. 8 in that the repetitive distance of the N-type emitter region 3 of the upper transistor of FIG. 10 is only 10 μm, and two adjacent P-type dense base regions 6 of the upper transistor are closely spaced and overlap with each other, the overlap portions forming a P-type base region 2 of the upper transistor. In doing so, one photoetching, one ion implantation, and one high temperature propulsion can be reduced, and the P-type base region 2 of the upper transistor is self-aligned with the P-type dense base region 6 of the upper transistor.

Figure 11:
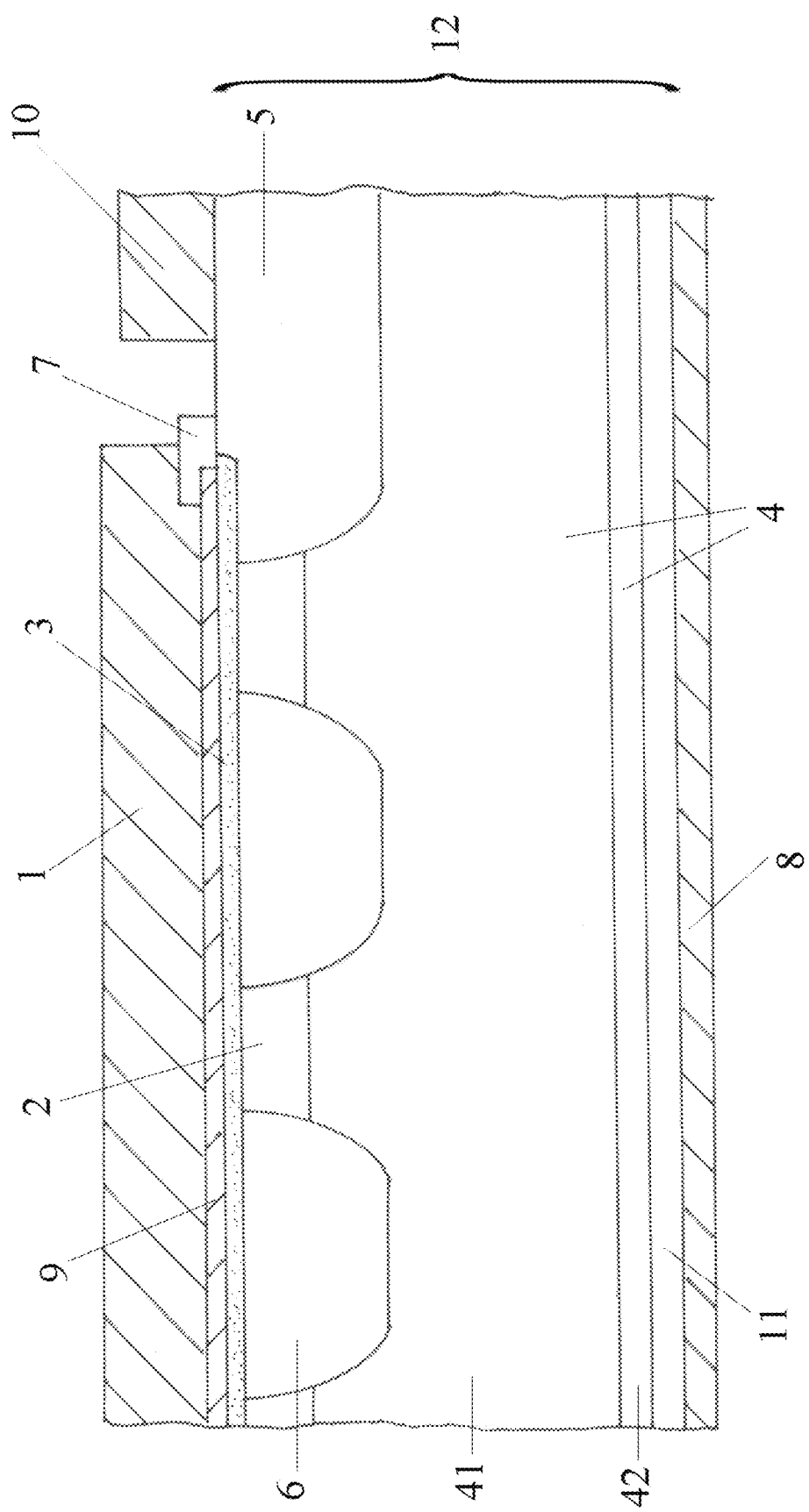
FIG. 11 is a structure diagram of a fourth embodiment of the gate-turn-off thyristor according to the present invention.

FIG. 11 is a structure diagram of a fourth embodiment of the present invention. FIG. 10 differs from FIG. 8 in that the P-type base region 2 of the upper transistor and the P-type dense base region 6 of the upper transistor of FIG. 11 are connected to the N-type emitter region 3 of the upper transistor. This is a special case where the width of the N-type emitter region 3 of the upper transistor of FIG. 10 is 20 μm (the width of the N-type emitter region 3 of the upper transistor of FIG. 8 is 6 μm), the repetitive distance of the N-type emitter region 3 of the upper transistor of FIG. 10 is also 20 μm, and the width of the emitter region rectangle 3 of the upper transistor is equal to the width of the repetitive distance of the emitter region rectangle 3 of the upper transistor, which means that a plurality of rectangular N-type emitter regions 3 of the upper transistor in the strip is connected in one piece. According to the structure, the N-type emitter region 3 of the upper transistor and the P-type dense base region 6 of the upper transistor are self-aligned, and the consistency of electrical parameters is good. Another benefit of this structure is that the repetitive distance of the upper transistor P-type dense base region can be made smaller, such as the width 2 μm of the P-type dense base region of the upper transistor and the repetitive distance 8 μm of the P-type dense base region of the upper transistor, thereby further reducing the peripheral current density.

Figure 12:
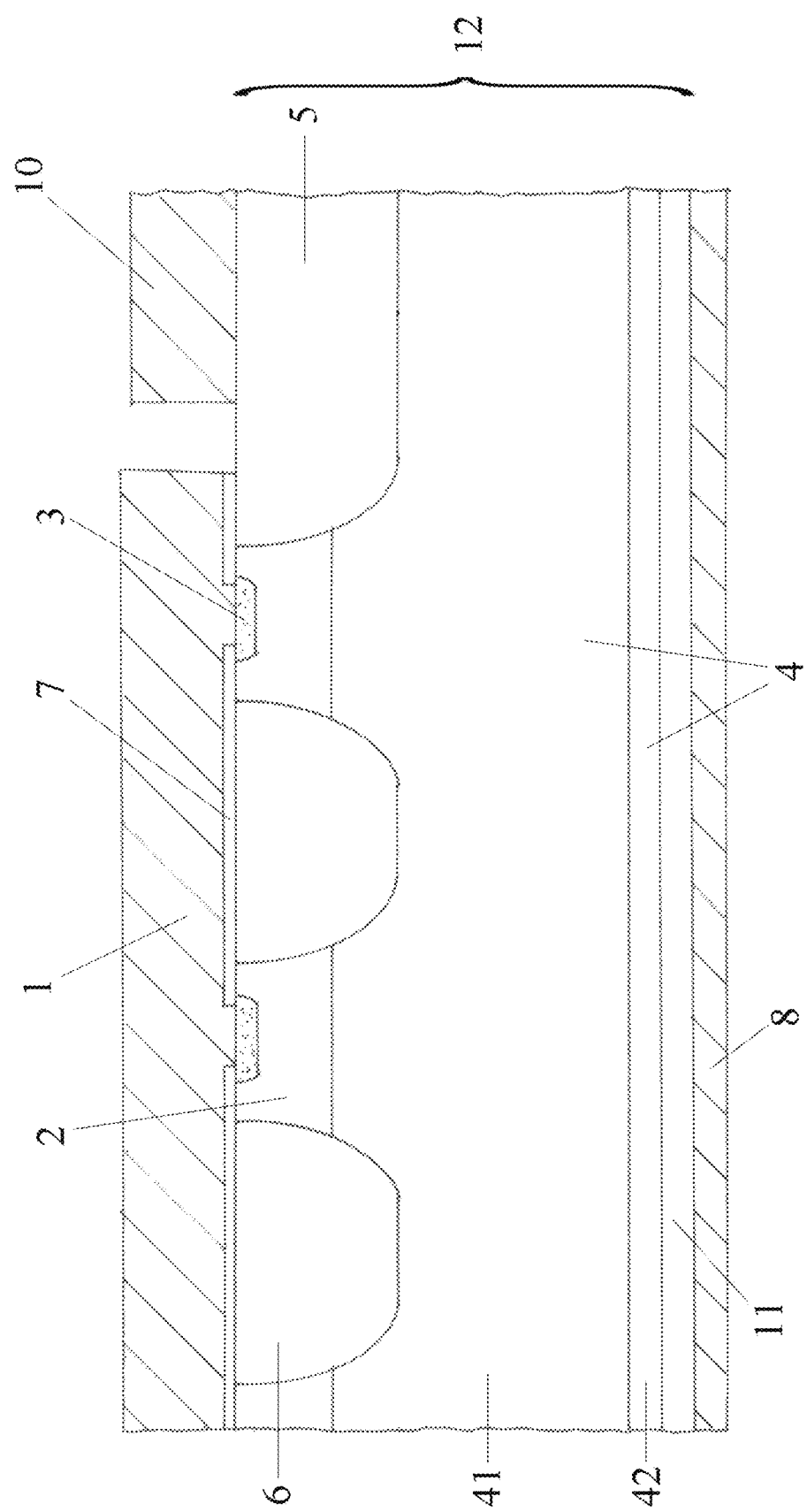
FIG. 12 is a structure diagram of a fifth embodiment of the gate-turn-off thyristor according to the present invention.

FIG. 12 is a structure diagram of a fifth embodiment of the present invention. FIG. 11 differs from FIG. 8 in that the N-type emitter region 3 of the upper transistor of FIG. 12 is directly connected to the cathode metal layer 1. The structure is simple in process, easy to machine and low in cost.

At present, the main power transistor in the high-voltage large-power field is an IGBT. The IGBT is a voltage driven power transistor. As long as the gate oxide layer has a pinhole, the IGBT fails. Therefore, a high-voltage large-power IGBT is expensive. Also the IGBT is subject to a latch. The gate-turn-off thyristor does not have the latch problem, and has a thyristor temperature lower than that of the IGBT, a reliability higher than that of the IGBT, and a cost far lower than that of the IGBT. The gate-turn-off thyristor provided by the invention is expected to replace the IGBT and become a mainstream product in high-voltage large-power devices.

According to the invention, the junction depth of the P-type dense base region of the upper transistor and the P-type dense base region bus bars can be deeper than that of the P-type base region of the upper transistor or shallower than that of the P-type base region of the upper transistor.

The bottom lower transistor P-type emitter region of the silicon substrate provided by the invention can be the whole bottom layer or a part of the bottom layer, and the other part is the N-type collector region of the upper transistor. The structure is called "anode short circuit", and has the functions of improving the turn-off speed and reducing the trailing time of current, with the price that the cost and the difficulty are increased, and fragments are caused easily.

The embodiments above shall be used only to describe the invention and not to limit the invention. Accordingly, it will be understood by those skilled in the art that any obvious change to the invention without departing from the spirit and scope of the invention shall fall within the protection scope of the invention.

What is claimed is:

1. A gate-turn-off thyristor, comprising:
   a plurality of strips formed by repeatedly arranging a plurality of N-type emitter regions with a high doping concentration of an upper transistor on an upper surface of an N-type silicon substrate with a high resistivity, wherein a periphery of each strip of the plurality of strips is surrounded with a P-type dense base region bus bar of the upper transistor, a cathode metal layer is disposed on an N-type emitter region of the plurality of N-type emitter regions of the upper transistor, and a P-type base region of the upper transistor is disposed below the N-type emitter region of the upper transistor;
   a side of the P-type base region of the upper transistor is connected to a P-type dense base region of the upper transistor or the P-type dense base region bus bar of the upper transistor, the P-type dense base region of the upper transistor or the P-type dense base region bus bar of the upper transistor has a doping concentration higher than a doping concentration of the P-type base region of the upper transistor, wherein an N-type collector region of the upper transistor is arranged below the P-type base region of the upper transistor, the P-type dense base region of the upper transistor and the P-type dense base region bus bar of the upper transistor, and a P-type emitter region of a lower transistor is disposed below the N-type collector region of the upper transistor;
   the P-type emitter region of the lower transistor is located at a bottom layer of the N-type silicon substrate; and
   a lower surface of the P-type emitter region of the lower transistor is connected to an anode metal layer, and a gate metal layer is disposed above the N-type silicon substrate, wherein
   the P-type dense base region of the upper transistor and the P-type dense base region bus bar of the upper transistor are intersected or parallel;
   an upper surface of the P-type dense base region bus bar of the upper transistor is connected with the gate metal layer;
   a repetitive distance between adjacent N-type emitter regions of the upper transistor in each strip is within 50 μm; and
   a die of the gate-turn-off thyristor is a square die.

2. The gate-turn-off thyristor according to claim 1, wherein the P-type base region of the upper transistor and the P-type dense base region of the upper transistor are indirectly connected with the cathode metal layer by an oxide layer.

3. The gate-turn-off thyristor according to claim 1, wherein an upper surface of the N-type emitter region of the upper transistor is directly connected with the cathode metal layer.

4. The gate-turn-off thyristor according to claim 1, wherein a doped polycrystalline silicon layer is further provided between the cathode metal layer and the N-type silicon substrate, and an upper surface of the N-type emitter region of the upper transistor is indirectly connected with the cathode metal layer by the doped polycrystalline silicon layer.

5. The gate-turn-off thyristor according to claim 1, wherein the N-type collector region of the upper transistor is further divided into an upper layer and a lower layer, wherein a resistivity of the lower layer is lower than a resistivity of the upper layer.

6. The gate-turn-off thyristor according to claim 1, wherein adjacent P-type dense base regions of the upper transistor are overlapped with each other, and overlapped portions of the adjacent P-type dense base regions form the P-type base region of the upper transistor.

7. The gate-turn-off thyristor according to claim 1, wherein the N-type emitter region of the upper transistor is connected above both an upper surface of the P-type base region of the upper transistor and an upper surface of the P-type dense base region of the upper transistor.

8. The gate-turn-off thyristor according to claim 1, wherein a surface impurity concentration of the P-type dense base region of the upper transistor is 3 times or more higher than a surface impurity concentration of the P-type base region of the upper transistor.

9. The gate-turn-off thyristor according to claim 1, wherein a thickness of the P-type emitter region of the lower transistor is less than 3 μm.

10. A manufacturing method for the gate-turn-off thyristor of claim 1, comprising the process steps of:
  A. providing a set of masks for the gate-turn-off thyristor, wherein the set of masks comprises: a first mask and a second mask, wherein the first mask is a mask of an N-type emitter region pattern of an upper transistor, wherein the N-type emitter region pattern of the upper transistor is composed of a plurality of N-type emitter region strips formed by repeatedly arranging a plurality of N-type emitter region pattern units of the upper transistor, and a repetitive distance between adjacent N-type emitter regions of the upper transistor in the plurality of N-type emitter region strips of the upper transistor is within 50 μm;
  wherein the second mask contains a P-type dense base region pattern of the upper transistor and a P-type dense base region bus bar pattern of the upper transistor, wherein the P-type dense base region pattern of the upper transistor is composed of a plurality of P-type dense base region strips of the upper transistor formed by repeatedly arranging a plurality of P-type dense base region pattern units of the upper transistor;
  a repetitive distance of adjacent P-type dense base region pattern units of the upper transistor in a P-type dense base region strip of the plurality of P-type dense base region strips of the upper transistor is identical to a repetitive distance of adjacent N-type emitter region pattern units of the upper transistor in an N-type emitter region strip of the plurality of N-type emitter region strips of the upper transistor;
  the P-type dense base region bus bar pattern of the upper transistor is intersected with or parallel to the P-type dense base region pattern of the upper transistor, and the P-type dense base region bus bar pattern of the upper transistor surrounds the P-type dense base region strip of the upper transistor; and
  when the P-type dense base region pattern of the upper transistor on the second mask is aligned with the N-type emitter region pattern of the upper transistor on the first mask, the P-type dense base region bus bar pattern of the upper transistor also surrounds the N-type emitter region strip of the upper transistor;
  B. providing the N-type silicon substrate with the high resistivity;
  C. forming the P-type base region of the upper transistor, the P-type dense base region of the upper transistor, and the P-type dense base region bus bar of the upper transistor by adopting the second mask through an oxidation process, a photoetching process, a corrosion process, a boron ion implantation process and a diffusion propulsion process, wherein an oxide layer is formed on an upper surface of the N-type silicon substrate after the diffusion propulsion process;
  D. selectively etching the oxide layer by adopting the first mask, completely etching the oxide layer of an emitter region window of the upper transistor on the P-type base region of the upper transistor, and keeping the oxide layer on the P-type dense base region of the upper transistor and the P-type dense base region bus bar of the upper transistor;
  E. depositing a polycrystalline silicon layer;
  F. implanting phosphorus ions to form an N-type doped polycrystalline silicon layer, and causing the N-type doped polycrystalline silicon layer, by the diffusion propulsion process into an upper part of the P-type base region of the upper transistor to form the N-type emitter region of the upper transistor;
  G. selectively masking and etching the N-type doped polycrystalline silicon layer, keeping the N-type doped polycrystalline silicon layer above the N-type emitter region of the upper transistor, and not keeping the N-type doped polycrystalline silicon layer above the P-type dense base region bus bar of the upper transistor;
  H. selectively etching the oxide layer, and completely etching the oxide layer on the P-type dense base region bus bar of the upper transistor to form a contact hole;
  I. sputtering a metal layer;
  J. selectively masking and etching the metal layer to form the cathode metal layer and the gate metal layer, wherein the cathode metal layer and the gate metal layer are separated from each other;
  K. thinning a back surface;
  L. removing a damaged layer from the back surface;
  M. implanting boron into the back surface;
  N. annealing and activating; and
  O. sputtering the anode metal layer on the back surface.

11. The gate-turn-off thyristor according to claim 1, wherein the P-type base region of the upper transistor is disposed in a same layer as the P-type dense base region of the upper transistor or the P-type dense base region bus bar of the upper transistor.

12. The gate-turn-off thyristor according to claim 1, wherein the P-type base region of the upper transistor is disposed in a same layer as the P-type dense base region of the upper transistor and the P-type dense base region bus bar of the upper transistor.

13. The gate-turn-off thyristor according to claim 1, wherein the P-type dense base region of the upper transistor comprises a first P-type dense base region of the upper transistor and a second P-type dense base region of the upper transistor that is adjacent to the first P-type dense base region of the upper transistor, and the P-type base region of the upper transistor is positioned between the first P-type dense base region of the upper transistor and the second P-type dense base region of the upper transistor.

14. The gate-turn-off thyristor according to claim 1, wherein the P-type dense base region of the upper transistor is adjacent to the P-type dense base region bus bar of the upper transistor, and the P-type base region of the upper transistor is positioned between the P-type dense base region of the upper transistor and the P-type dense base region bus bar of the upper transistor.

* * * * *